(12) United States Patent
Zhong et al.

(10) Patent No.: US 8,460,988 B2
(45) Date of Patent: Jun. 11, 2013

(54) METHOD FOR MANUFACTURING SEMICONDUCTOR DEVICE

(75) Inventors: Huicai Zhong, Beijing (CN); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 30 days.

(21) Appl. No.: 13/061,824

(22) PCT Filed: Sep. 26, 2010

(86) PCT No.: PCT/CN2010/077311
§ 371 (c)(1),
(2), (4) Date: Mar. 2, 2011

(87) PCT Pub. No.: WO2011/124060
PCT Pub. Date: Oct. 13, 2011

(65) Prior Publication Data
US 2012/0220097 A1    Aug. 30, 2012

(30) Foreign Application Priority Data
Apr. 7, 2010   (CN) .......................... 2010 1 0142041

(51) Int. Cl.
*H01L 21/336*   (2006.01)
(52) U.S. Cl.
USPC ........................................ 438/197; 438/300
(58) Field of Classification Search
CPC ................. H01L 21/823814; H01L 21/823864
USPC .......... 438/300, 197; 257/E21.619, E21.634, 257/E21.431
See application file for complete search history.

(56) References Cited

U.S. PATENT DOCUMENTS

| | | | |
|---|---|---|---|
| 2005/0280098 A1* | 12/2005 | Shin et al. | 257/371 |
| 2007/0034906 A1* | 2/2007 | Wang et al. | 257/224 |
| 2008/0157119 A1* | 7/2008 | Tsai | 257/190 |
| 2011/0278680 A1* | 11/2011 | Tews et al. | 257/392 |
| 2011/0281413 A1* | 11/2011 | Zhong et al. | 438/299 |

* cited by examiner

*Primary Examiner* — Khiem D Nguyen
(74) *Attorney, Agent, or Firm* — Troutman Sanders LLP

(57) ABSTRACT

A method of manufacturing a semiconductor device is provided, in which after forming a gate stack and a first spacer thereof, a second spacer and a third spacer are formed; and then an opening is formed between the first spacer and the third spacer by removing the second spacer. The range of the formation for the raised active area 220 is limited by forming an opening 214 between the first spacer 208 and the third spacer 212. The raised active area 220 is formed in the opening 214 in a self-aligned manner, so that a better profile of the raised active area 220 may be achieved and the possible shorts between adjacent devices caused by an unlimited manner may be avoided. Moreover, based on such a manufacturing method, it is easy to make the gate electrode 204 to be flushed with the raised active area 220, and is also easy to implement the dual stress nitride process so as to increase the mobility of the device.

9 Claims, 12 Drawing Sheets

METHOD FOR MANUFACTURING SEMICONDUCTOR DEVICE

BENEFIT CLAIMS

This application is a US National Stage of International Application No. PCT/CN2010/077311, filed Sep. 26, 2010, which claims the benefit of CN 201010142041.6, filed Apr. 7, 2010.

FIELD OF THE INVENTION

The present invention generally relates to a method of manufacturing a semiconductor device, and particularly, to a method of manufacturing a semiconductor device in which an raised source/drain structure on active device area is formed by self-alignment and self-limitation.

DESCRIPTION OF THE PRIOR ART

The raised active area of a device is formed by performing epitaxial growing on the entire active area, i.e. the source and drain area, in the conventional manufacturing process. Such kind of process can reduce the resistivity of the device extension area and can more easily form a contact, so it is still desirable after entering 32 nm technology and beyond generation. However, the raised active area may be grown across an isolation area to result in shorts between the adjacent devices, since the raised active area is formed through epitaxial growing on the entire active area without any restriction on the side of the isolation area. Meanwhile, it is difficult to make the raised active area to be of the same height as the gate electrode, and it is difficult to realize the dual stress nitride process that will increases the mobility in such a process.

Therefore, there is a need to provide a method of manufacturing a semiconductor device in which the raised active area is formed by self-alignment and self-limitation.

SUMMARY OF THE INVENTION

The present invention provides a method of manufacturing a semiconductor device. The method comprises: providing a semiconductor substrate; forming a gate stack on the semiconductor substrate, and forming a first spacer on the sidewalls of the gate stack; forming a second spacer on the sidewalls of the first spacer, and forming a third spacer on the sidewalls of the second spacer; removing the second spacer to form an opening; etching the semiconductor substrate through the opening to form a cavity within the substrate; forming an embedded active area in the cavity; and forming a raised active area within the opening; and siliciding the device to form a metal silicide layer.

The present invention also provides a method of manufacturing a semiconductor device. The method comprises: providing a semiconductor substrate; forming a gate stack on the semiconductor substrate, and forming a first spacer on the sidewalls of the gate stack; etching parts of the semiconductor substrate on both sides of the gate stack to form a cavity; forming an embedded active area in the cavity; forming a second spacer on the sidewalls of the first spacer, and forming a third spacer on the sidewalls of the second spacer; removing the second spacer to form an opening; forming an raised active area within the opening; and forming a metal silicide layer by siliciding active area and/or gate electrode of the device.

By means of the method of the present invention, the range and direction of the raised active area can be effectively restricted, thereby forming the raised source/drain on active area on the active area in a self-aligned manner.

DETAILED DESCRIPTION OF THE INVENTION

Figure 1:
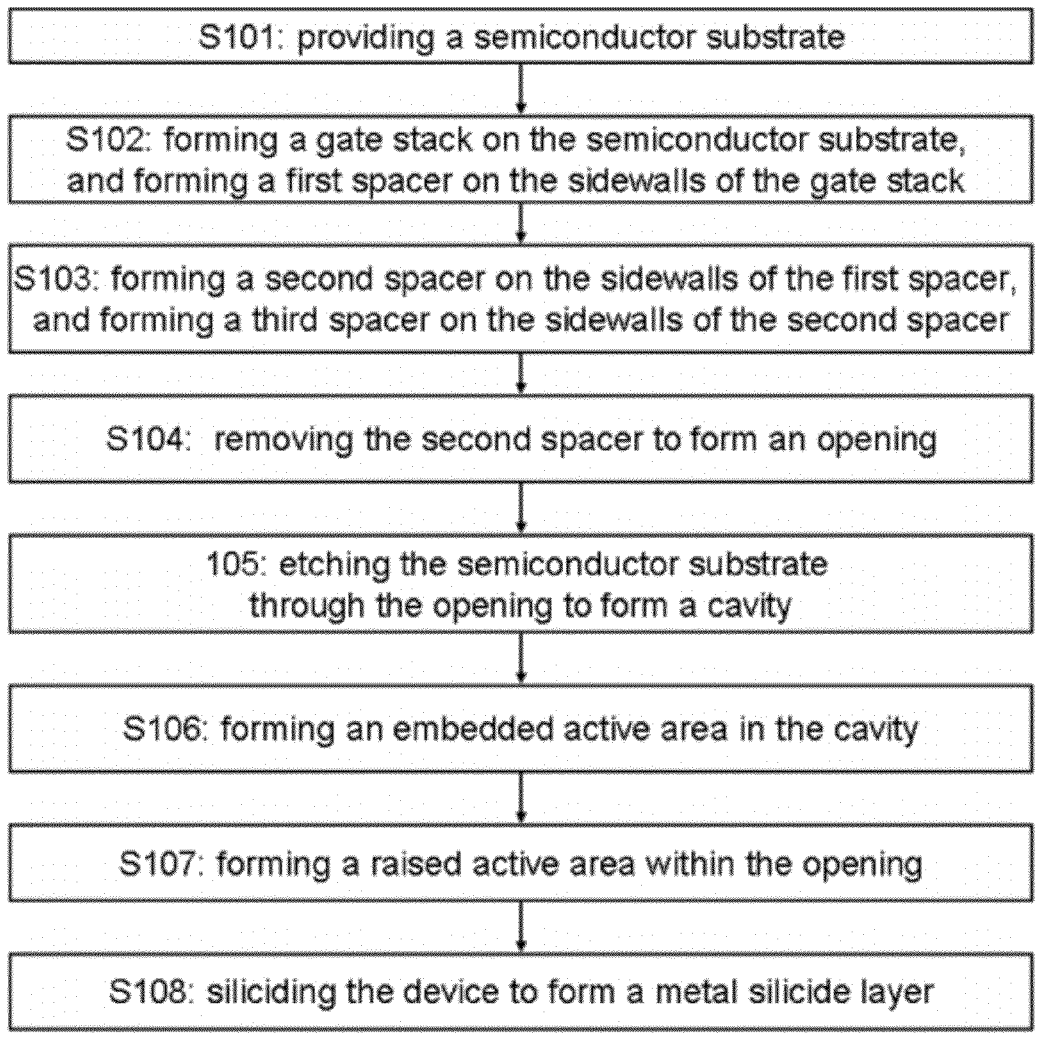
FIG. 1 is a flow chart of the method of manufacturing a semiconductor device according to a first embodiment of the present invention.

The present invention generally relates to a method for manufacturing a semiconductor device. The following disclosure provides many different embodiments or examples for realizing different structures of the present invention. To simplify the disclosure of the present invention, the components and configuration of specific examples are described in the following. Of course, they are merely examples and are not intended to limit the invention. In addition, reference numerals and/or letters can be repeated in different examples in the present invention, and such repetition is for the purpose of concision and clarity, which in itself does not discuss the relationship between the various embodiments and/or configurations. Furthermore, the present invention provides examples of various specific techniques and materials, but those skilled in the art will be aware of the applicability of other techniques and/or materials. Moreover, the structure in which the first element is "above" the second element as described below may comprise the embodiment where the first and second elements are formed to be in direct contact, or it may also comprise the embodiment where a further element is formed between the first and second elements, in which case the first and second elements may not be in direct contact.

First Embodiment

Figure 2:
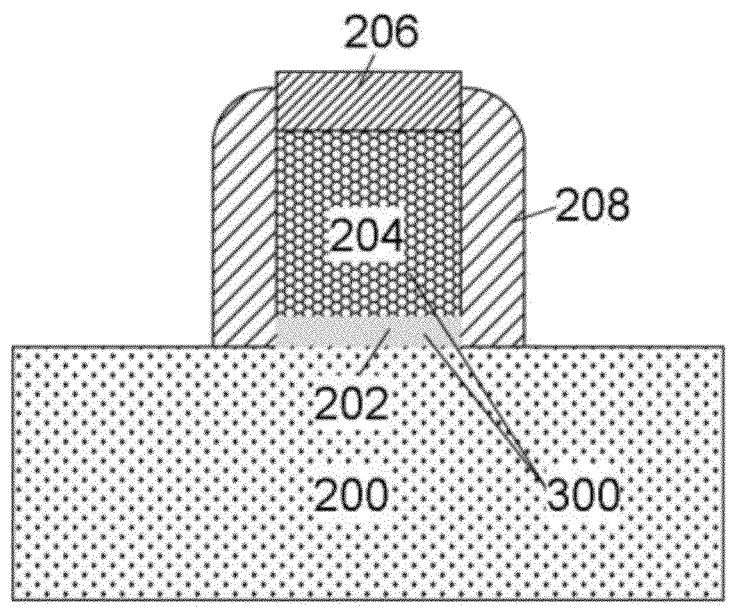
FIGS. 2-11 schematically illustrate the respective manufacturing stages of the semiconductor device according to the first embodiment of the present invention.

According to the first embodiment of the present invention, reference is now made to FIG. 1. FIG. 1 is a flow chart of the method of manufacturing a semiconductor device according to a first embodiment of the present invention. In step S101, a semiconductor substrate 200 is provided, as shown in FIG. 2. In the present embodiment, the substrate 200 comprises a silicon substrate (e.g. a wafer) in a crystal structure, but it may also comprise other basic semiconductors or compound semiconductors, such as Ge, SiGe, GaAs, InP, SiC or diamond, etc. According to the design requirements known in the prior art (e.g. a p-type substrate or an n-type substrate), the substrate 200 may comprise various doping configurations. In addition, the substrate 200 may optionally comprise an epitaxial layer which can be manipulated by stress to enhance its performance, and may comprise a Silicon-On-Insulator (SOI) structure.

In step S102, a gate stack 300 is formed on the semiconductor substrate 200, and a first spacer 208 is formed on the sidewalls of the gate stack 300, as shown in FIG. 2. The gate stack 300 generally comprises a gate dielectric layer 202 and a gate electrode 204. Preferably, the gate stack 300 may further comprise a gate cap 206 on top of the gate electrode 204, which is generally made of nitride materials and used for protecting the gate electrode 204 from being damaged in the subsequence process steps. It is not intended to limit the structures, materials, forming processes and steps, and the like of the gate stack 300 in the present invention. In one embodiment, the gate stack 300 can be formed by forming a gate dielectric layer 202, a gate electrode 204 and a gate cap 206 in this order on the semiconductor substrate 200 and then patterning the gate dielectric layer 202, the gate electrode 204 and the gate cap 206 by a dry etching process or a wet etching process. The gate dielectric layer 202 may comprise, but not limited to, nitride, oxide, oxynitride or high-k dielectric materials, etc. The gate electrode 204 may be a one-layer or multi-layer structure, and may comprise, but not limited to, metals, metal compound, polysilicon, metal silicide or any combination thereof. The first spacer 208 may be a one-layer or multi-layer structure, and may be formed of a nitride or oxide material, or any combination thereof, or other appropriate materials. In one embodiment, the first spacer 208 is a one-layer structure formed of a nitride. In other embodiments, the first spacer 208 may also be a two-layer structure or other multi-layer structures formed of nitride and other material(s). These are merely examples and the present invention is not limited thereto. The gate stack 300 and the first spacer 208 may be formed by conventional processes, such as thermal oxidization, sputtering, PLD, MOCVD, ALD, PEALD, or other appropriate methods.

Figure 3:
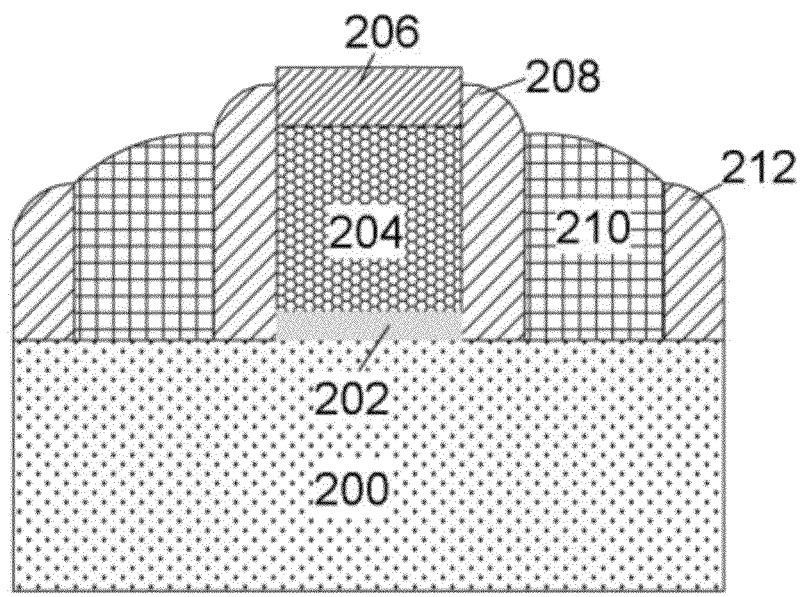

In step S103, a second spacer 210 is formed on the sidewalls of the first spacer 208, and a third spacer 212 is formed on the sidewalls of the second spacer 210, as shown in FIG. 3. The second spacer 210 may be formed of an oxide material. The third spacer 212 may be formed of nitride material, and may be a one-layer or multi-layer structure. In one embodiment, the third spacer 212 is a one-layer structure formed of a nitride. In other embodiments, the third spacer 212 can also be a two-layer structure or other multi-layer structures formed of nitride and other material(s). These are merely examples and the present invention is not limited thereto. The second spacer 210 and the third spacer 212 may be formed by conventional deposition processes, such as sputtering, PLD, MOCVD, ALD, PEALD or other appropriate methods.

In one embodiment, the first spacer 208, the third spacer 212 and the gate cap 206 are formed of nitride materials, and the second spacer 210 is formed of an oxide material. The first spacer 208, the second spacer 210, the third spacer 212 and the gate cap 206 can also be formed by selecting other appropriate materials according to the etching selectivity or other process requirements. One skilled in the art should understand that they can be formed by many ways of combination of materials, all of which can realize the present invention and thus should be included in the protection scope of the present invention.

Figure 4:
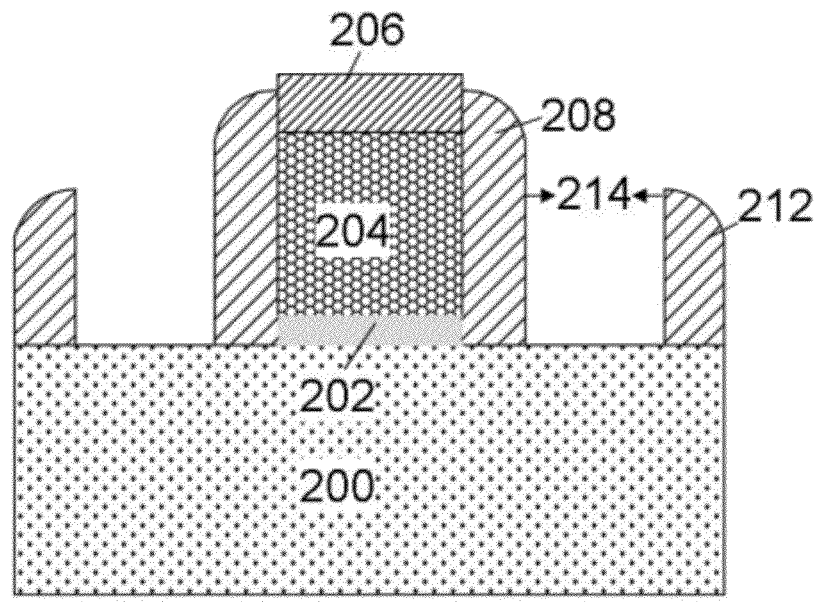

In step S104, the second spacer 210 is removed to form an opening 214, as shown in FIG. 4. The second spacer 210 has an etching selectivity different from the first spacer 208, the third spacer 212 and the gate cap 206. The second spacer 210 can be selectively removed by means of reactive ion etching (RIE) to form the opening 214.

Figure 5:
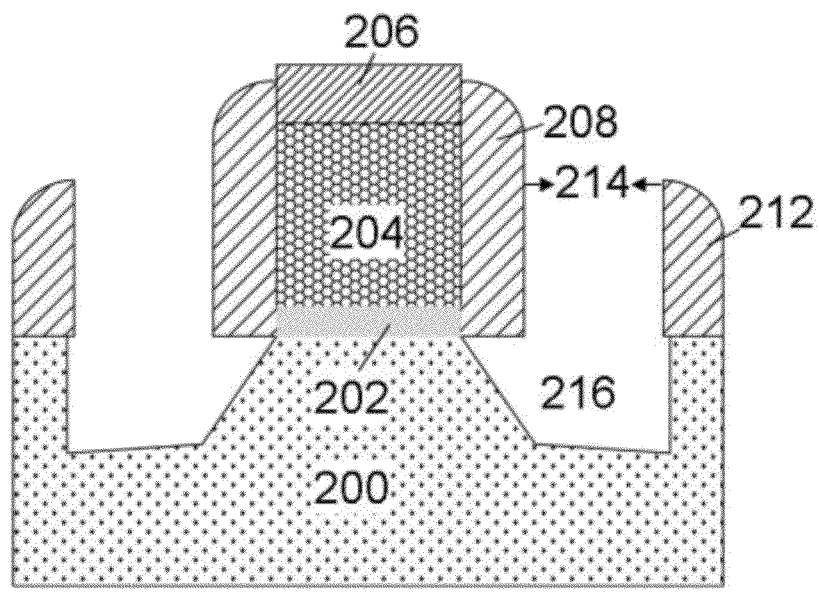

In step S105, the semiconductor substrate 200 is etched through the opening 214 to form a cavity 216, as shown in FIG. 5. The cavity 216 is formed, through the opening 214, within the semiconductor substrate 200 using a dry etching process or a wet etching process or a combination thereof. The portion of the semiconductor substrate 200 under the third spacer 212 may be selectively retained or removed.

Figure 6:
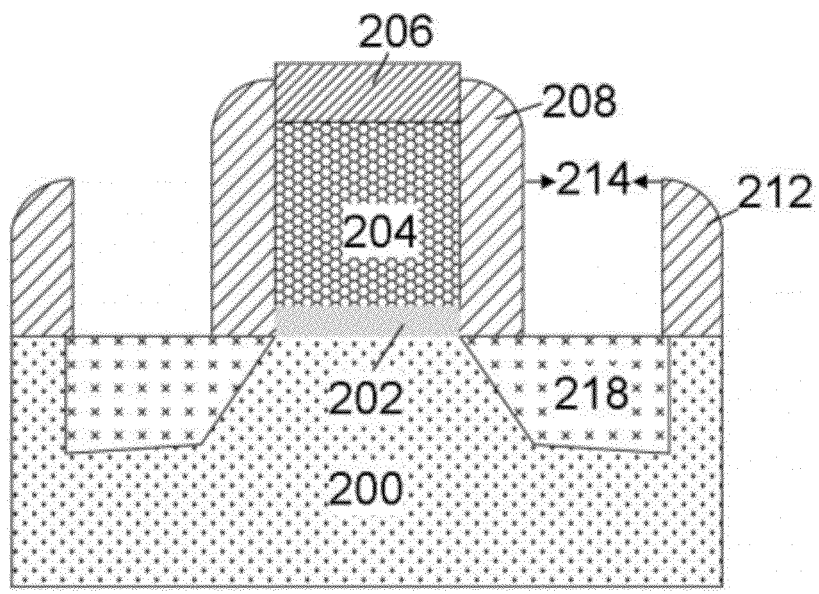

In step S106, an embedded active area 218 is formed in the cavity 216, as shown in FIG. 6. The embedded active area 218 generally refers to the embedded source area and the embedded drain area. The embedded active area 218 may be formed by depositing SiGe, SiC or other appropriate materials in the cavity 216 and at the same time performing in situ doping of p-type or n-type dopants into the embedded active area 218.

Figure 7:
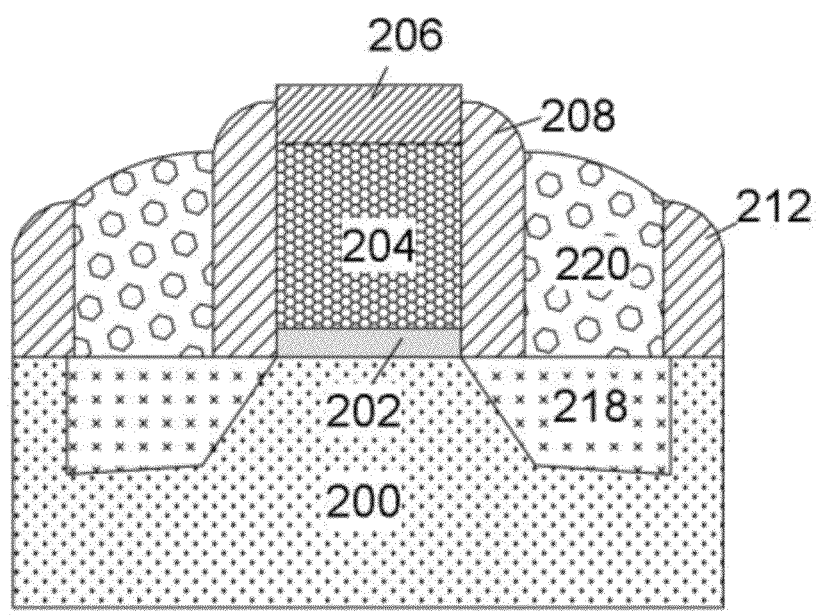

In step S107, a raised active area 220 is formed within the opening 214, as shown in FIG. 7. The raised active area 220 may be formed by the epitaxial growing method. The raised active area 220 is formed in the opening 214 in a self-aligned and self-limited manner, so that a better profile of the raised active area 220 may be achieved and possible shorts between adjacent devices caused by an unlimited manner may be avoided.

Figure 8:
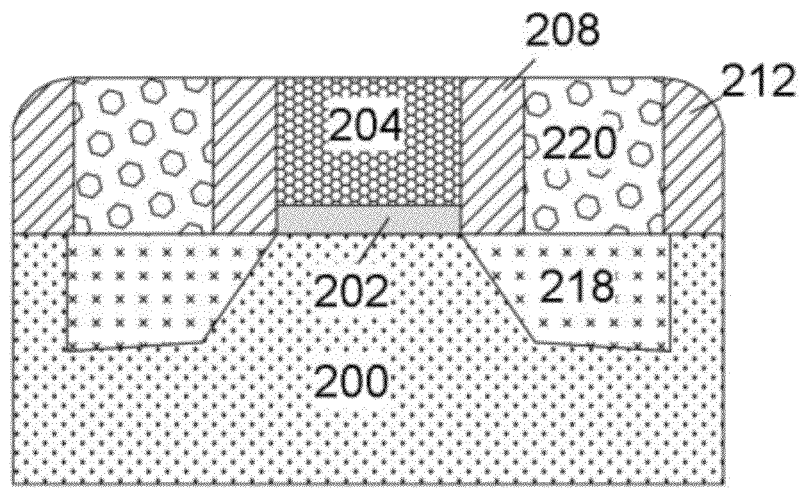

Particularly, after the formation of the raised active area 220, the device may be planarized, for example, using Chemical Mechanical Polishing (CMP) or other etching methods, so as to make the gate stack 300 to be flushed with the raised active area 220. In one embodiment, the entire gate cap 206 needs to be removed in order to realize planarization of the device, as shown in FIG. 8. In another embodiment, only a part of the gate cap 206 may be removed to realize planarization of the device (not shown). The purpose is to make the gate stack 300 to be substantially flushed with the raised active area 220, so the respective parts may be removed as appropriate. The present invention is not limited to the above.

Figure 9:
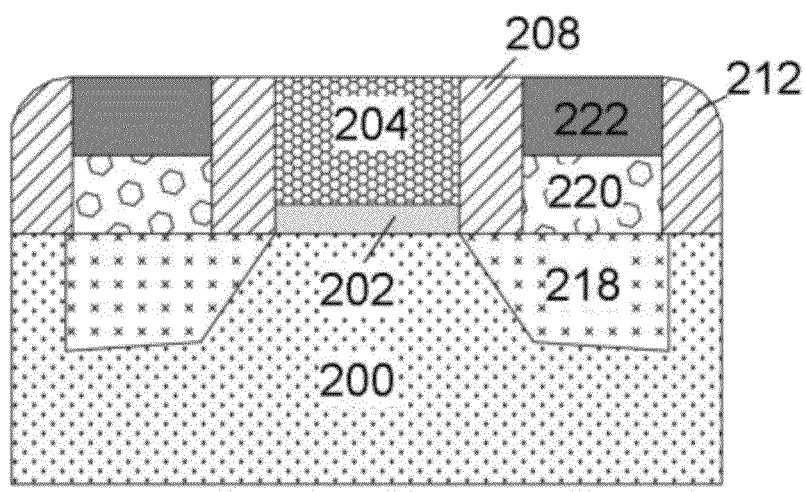

In step S108, the device is silicided to form a metal silicide layer 222, as shown in FIG. 9. The metal silicide layer 222 may be formed in a self-aligned manner. First, such a metal as Co, Ni, Mo, Pt or W, etc. is deposited on the device. Then annealing is performed and the metal reacts with any silicon surface of the device to form a metal silicide. The silicon surface can be single crystal silicon, or SiGe of the raised active area 220 and/or a polysilicon layer of the gate electrode 204 in the gate stack 300 or the like. Afterwards, the unreacted metal is removed to form a self-aligned metal silicide layer 222.

Figure 10:
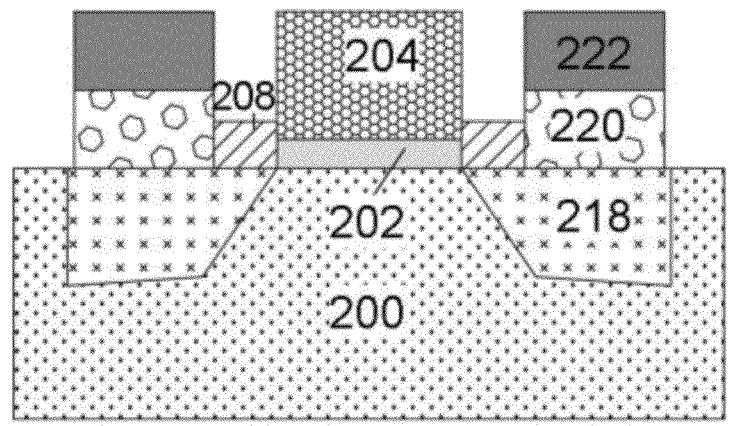
Figure 11:
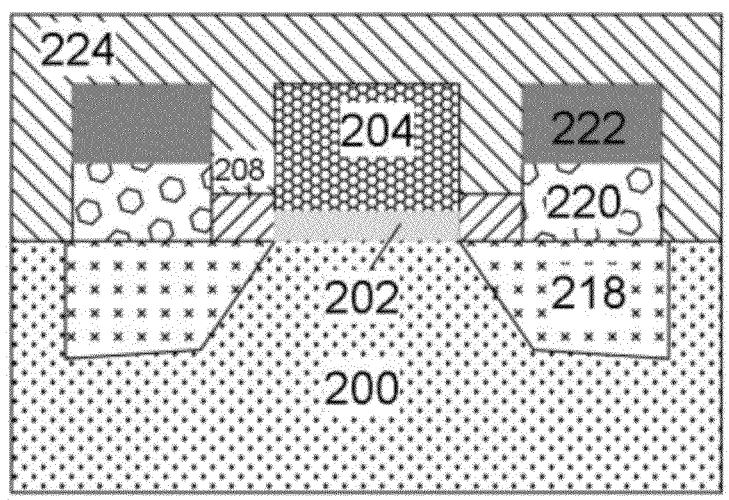

Particularly, after the formation of the metal silicide layer 222, the third spacer 212 and part of the first spacer 208 may be selectively removed by means of a dry etching process or a wet etching process, as shown in FIG. 10. Then a nitride material may be deposited by, but not limited to, a Plasma-enhanced chemical vapor deposition (PECVD) method to form a stress nitride layer 224, as shown in FIG. 11, thereby increasing the mobility of the device.

The method for manufacturing the device by limiting the range of formation of the raised active area 220 by means of the opening 214 between the first spacer 208 and the third spacer 212 is described as above. In this embodiment, the embedded active area 218 is formed after the formation of the opening 214.

Second Embodiment

The following will only describe the aspects of the second embodiment which are different from the first embodiment, while the parts which are not described should be considered as being carried out using the same steps, methods or processes as those in the first embodiment and thus will not be repeated here.

Figure 12:
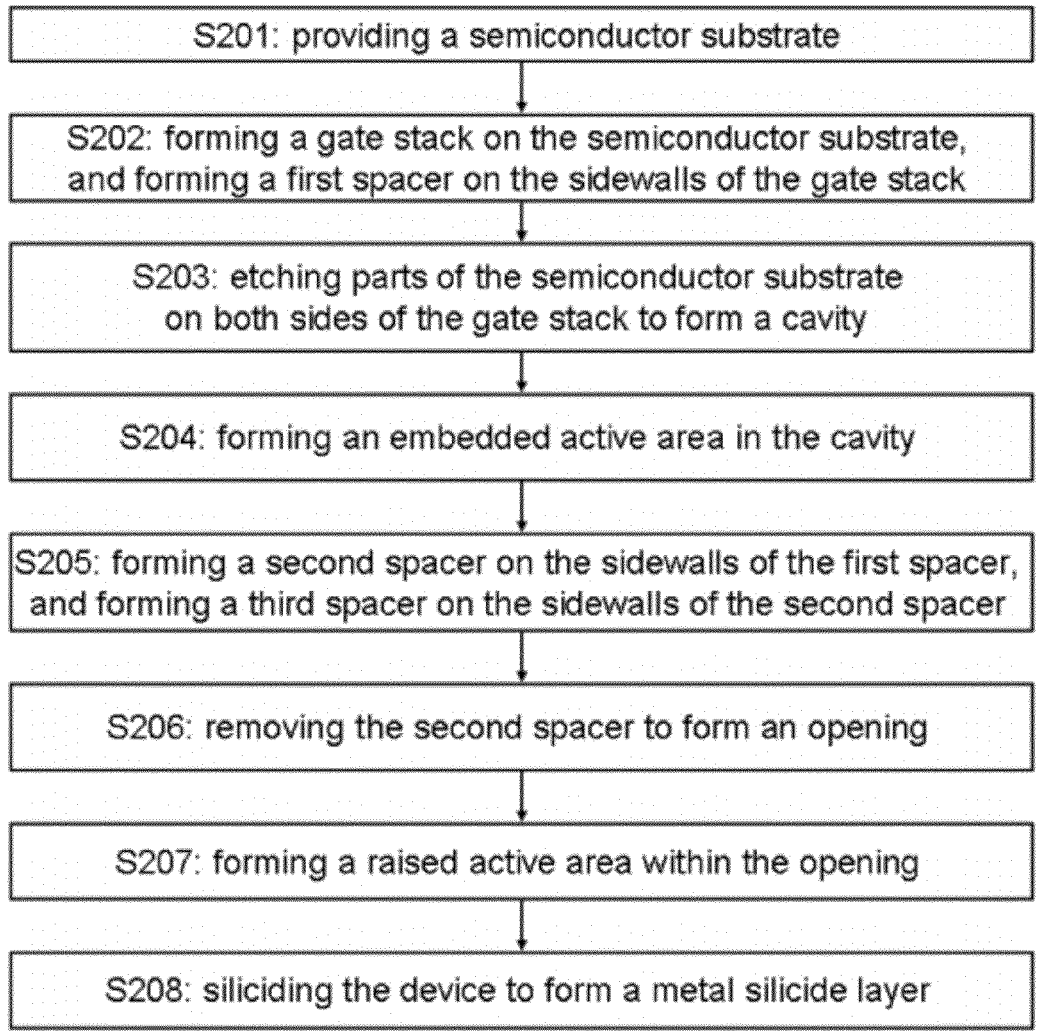
FIG. 12 is a flow chart of the method of manufacturing a semiconductor device according to a second embodiment of the present invention.

Referring to FIG. 12, FIG. 12 shows a flow chart of the method of manufacturing a semiconductor device according to the second embodiment of the present invention. Steps S201-S202 of the second embodiment according to the present invention are the same as steps S101-S102 in the first embodiment, and are considered as being carried out by the same steps, methods or processes as those in the first embodiment, and thus will not be repeated here.

Figure 13:
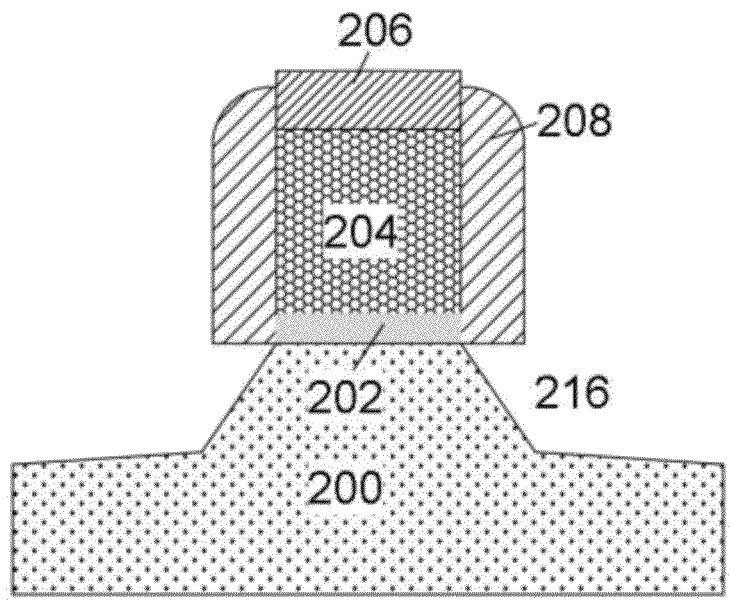
FIGS. 13-21 schematically illustrate the respective manufacturing stages of the semiconductor device according to the second embodiment of the present invention.

In step S203, parts of the semiconductor substrate 200 on both sides of the gate stack 300 are etched to form a cavity 216, as shown in FIG. 13. The cavity 216 may be formed within the semiconductor substrate 200 by means of dry etching or wet etching or a combination thereof.

Figure 14:
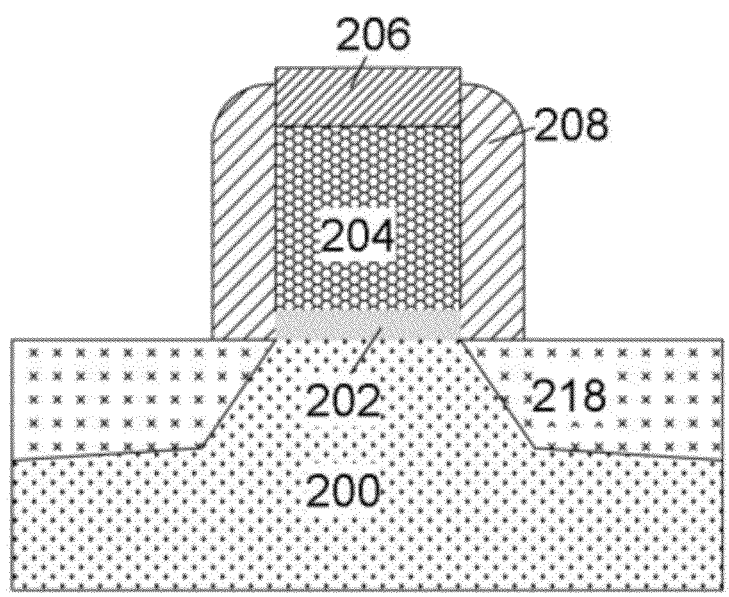

In step S204, an embedded active area 218 is formed in the cavity 216, as shown in FIG. 14. The embedded active area 218 generally refers to the embedded source area and the embedded drain area. The embedded active area 218 may be formed by depositing SiGe, SiC or other appropriate materials in the cavity 216, and at the same time performing in situ doping of p-type or n-type dopants into the embedded active area 218.

Figure 15:
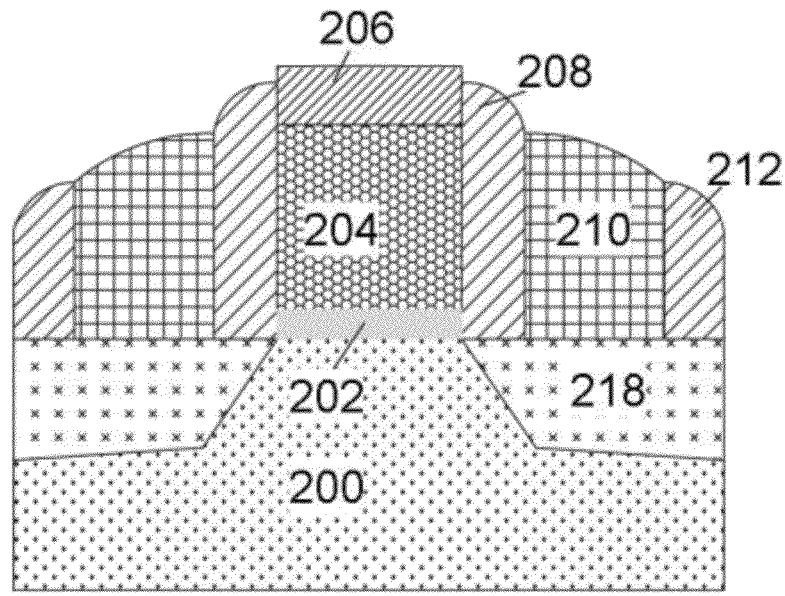

In step S205, a second spacer 210 is formed on the sidewalls of the first spacer 208, and a third spacer 212 is formed on the sidewalls of the second spacer 210, as shown in FIG. 15. The second spacer 210 may be formed of an oxide material, and the third spacer 212 may be formed of a nitride material. The second spacer 210 and the third spacer 212 may be formed by a conventional deposition process, such as sputtering, PLD, MOCVD, ALD, PEALD or other appropriate methods. The first spacer 208 and the third spacer 212 may be a one-layer or multi-layer structure and may be formed of a nitride material, an oxide material, or a combination thereof, or other appropriate materials. In one embodiment, both the first spacer 208 and the third spacer 212 are a one-layer structure formed of a nitride. In other embodiments, the first spacer 208 and the third spacer 212 can also be a two-layer structure or other multi-layer structures formed of nitride and other material(s). These are merely examples and the present invention is not limited thereto.

In one embodiment, the first spacer 208, the third spacer 212 and the gate cap 206 are each made of a nitride material, and the second spacer 210 is made of an oxide material. The first spacer 208, the second spacer 210, the third spacer 212 and the gate cap 206 can also be formed by selecting other appropriate materials according to the etching selectivity or other process requirements. One skilled in the art should understand that they can be formed by many combinations of materials, all of which can achieve the present invention and should be included in the protection scope of the present invention.

Figure 16:
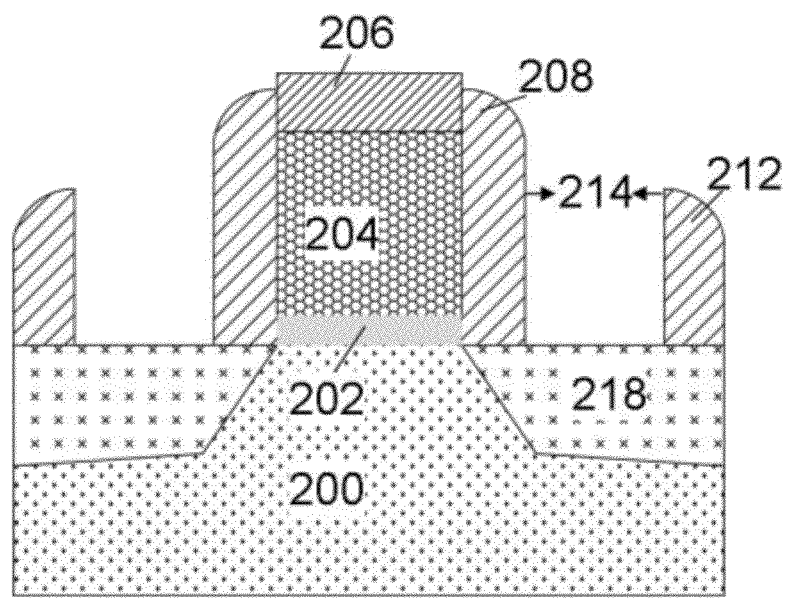

In step S206, the second spacer 210 is removed to form an opening 214, as shown in FIG. 16. The second spacer 210 has a different etching selectivity from the first spacer 208, the third spacer 212 and the gate cap 206, and can be selectively removed by means of RIE to form the opening 214. The first spacer 208, the second spacer 210, the third spacer 212 and the gate cap 206 can be formed by selecting appropriate materials according to the etching selectivity or other process requirements. One skilled in the art shall should understand that they can be formed by many combinations of materials, all of which can achieve the present invention and should be included in the protection scope of the present invention.

Figure 17:
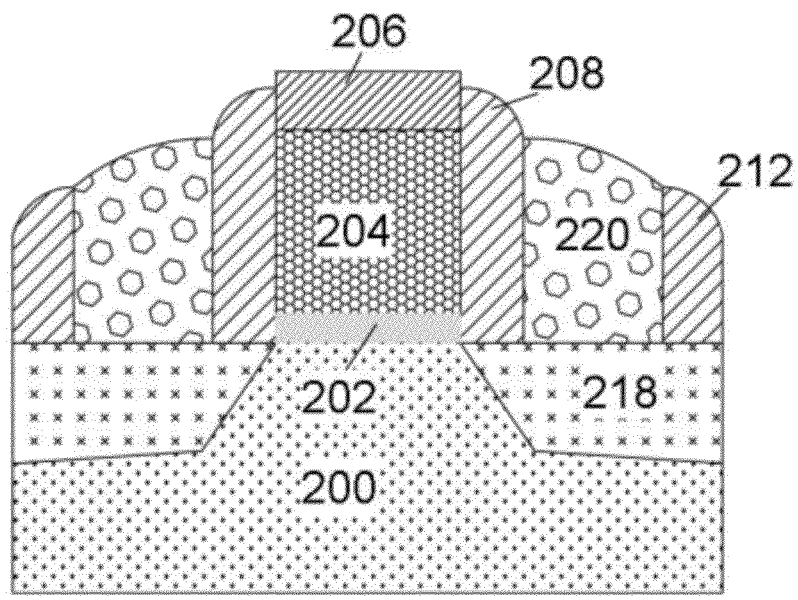

In step S207, a raised active area 220 is formed within the opening 214, as shown in FIG. 17. The raised active area 220 may be formed by epitaxial growing. The raised active area 220 is formed in the opening 214 in a self-aligned and self-limited manner, so that a better profile of the raised active area 220 may be achieved, and the possible shorts between adjacent devices caused by an unlimited manner may be avoided.

Figure 18:
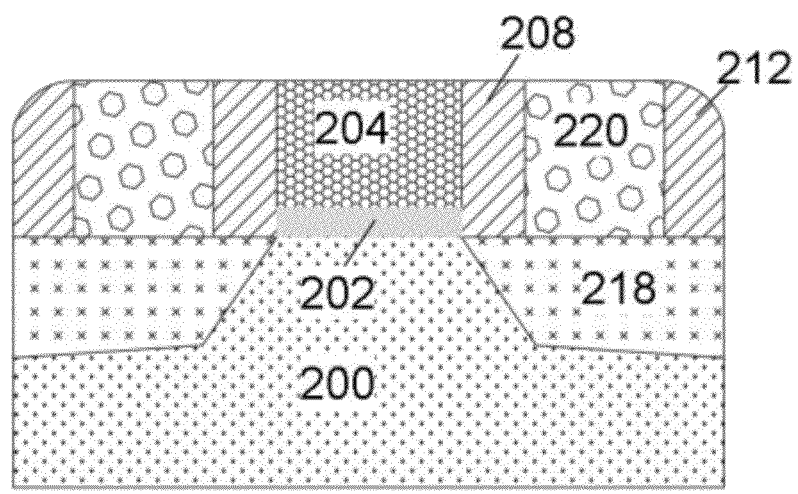

Particularly, after the formation of the raised active area 220, the device may be planarized, for example, using Chemical Mechanical Polishing (CMP) or other etching methods, so as to make the gate stack 300 to be flushed with the raised active area 220. In one embodiment, the entire gate cap 206 needs to be removed in order to realize planarization of the device, as shown in FIG. 18. In another embodiment, only a part of the gate cap 206 may be removed to realize planarization of the device (not shown). The purpose is to make the gate stack 300 to be substantially flushed with the raised active area 220, and therefore the respective parts may be removed as required. The present invention is not limited to the above.

Figure 19:
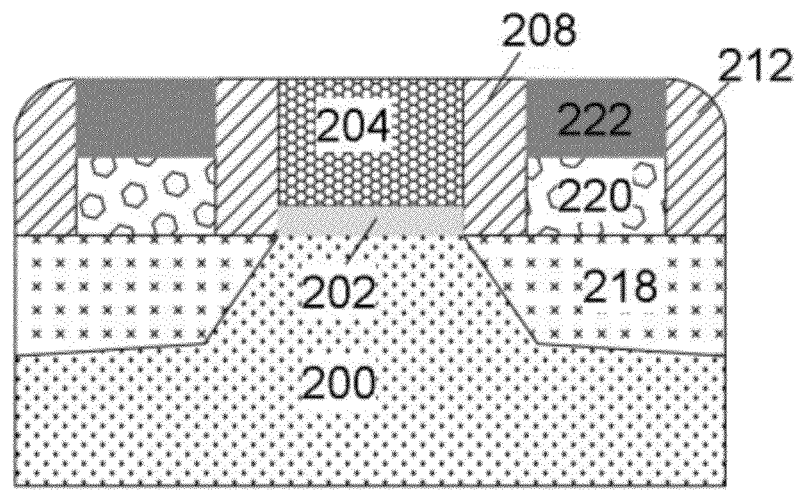

In step S208, the device is slicided to form a metal silicide layer 222, as shown in FIG. 19. The metal silicide layer 222 may be formed in a self-aligned manner. First, such a metal as Co, Ni, Mo, Pt or W, etc. is deposited on the device. Then annealing is performed and the metal reacts with any silicon surface contacting with it to form metal silicide. The silicon surface can be the polysilicon layer of the raised active area 220 and/or the gate electrode 204 in the gate stack 300. Afterwards, the unreacted metal is removed to form a self-aligned metal silicide layer 222.

Figure 20:
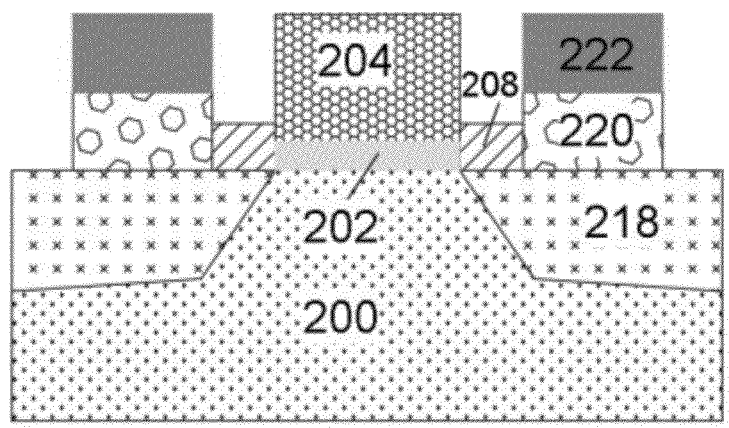
Figure 21:
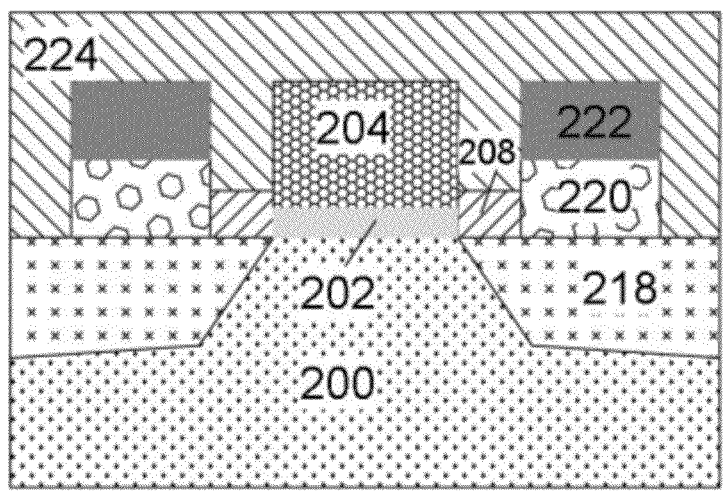

Particularly, after the formation of the metal silicide layer 222, the third spacer 212 and a part of the first spacer 208 may be selectively removed by means of a dry etching process or a wet etching process, as shown in FIG. 20. Then a nitride material may be deposited by, but not limited to, PECVD to form a stress nitride layer 224, as shown in FIG. 21, thereby increasing the mobility of the device.

The above describes the device manufacturing method which limits the range of the formation for the raised active area 220 by means of the opening 214 between the first spacer 208 and the third spacer 212. In this embodiment, the opening 214 is formed after the formation of the embedded active area 218.

The present invention describes a device manufacturing method in which a raised active area is formed in a self-aligned and self-limited manner. According to the present invention, the range of the formation for the raised active area 220 is limited by forming the opening 214 between the first spacer 208 and the third spacer 212. By forming the raised active area 220 within the opening 214 in a self-aligned manner, a better profile of the raised active area 220 may be achieved and the possible shorts between adjacent devices caused by the unlimited manner may be avoided. Moreover, based on such a manufacturing method, it is easy to make the gate electrode 204 to be flushed with the raised active area 220, and is also easy to implement the dual stress nitride process so as to increase the mobility of the device.

Although the example embodiments and the advantages thereof have been described in detail, it shall be understood that various changes, substitutions and modifications can be made to said embodiments without departing from the spirit of the invention and the protection scope defined by the appended claims. As for other examples, those ordinarily skilled in the art shall easily understand that the sequence of the process steps may be changed without departing from the protection scope of the present invention.

In addition, the application of the present invention is not limited to the techniques, mechanisms, fabrication, compositions, means, methods and steps in the specific embodiments described in the description. On the basis of the disclosure of the present invention, those ordinarily skilled in the art shall easily understand that the existing or to be developed techniques, mechanisms, fabrication, compositions, means, methods and steps, which have substantially the same function or achieve substantially the same effect as the respective embodiments described in the present invention, can also be used according to the present invention. Therefore, the appended claims intend to include such techniques, mechanisms, fabrication, compositions, means, methods and steps in the protection scope thereof.

What is claimed is:

1. A method of manufacturing a semiconductor device, comprising steps of:
   A. providing a semiconductor substrate;
   B. forming a gate stack on the semiconductor substrate, and forming a first spacer on a sidewalls of the gate stack;
   C. etching parts of the semiconductor substrate on both sides of the gate stack to form a cavity;
   D. forming an embedded active area in the cavity;
   E. forming a second spacer on a sidewalls of the first spacer, and forming a third spacer on a sidewalls of the second spacer;
   F. removing the second spacer to form an opening;
   G. forming an raised active area within the opening; and
   H. siliciding the semiconductor device to form a metal silicide layer.

2. The method according to claim 1, further comprising a step between step G and step H:
   planarizing the semiconductor device to make the gate stack to be substantially flushed with the raised active area.

3. The method according to claim 1, further comprising a step after step H:
   removing the third spacer and parts of the first spacer, and forming a stress nitride layer to cover the semiconductor device.

4. The method according to claim 1, wherein the first spacer, the third spacer and a gate cap are each formed of a nitride material.

5. The method according to claim 1, wherein the second spacer is formed of an oxide material.

6. The method according to claim 2, wherein the first spacer, the third spacer and a gate cap are each formed of a nitride material.

7. The method according to claim 3, wherein the first spacer, the third spacer and a gate cap are each formed of a nitride material.

8. The method according to claim 2, wherein the second spacer is formed of an oxide material.

9. The method according to claim 3, wherein the second spacer is formed of an oxide material.

* * * * *